(12) United States Patent
Smits et al.

(10) Patent No.: US 11,310,915 B2
(45) Date of Patent: Apr. 19, 2022

(54) THERMOFORMING AN ELECTRONIC DEVICE WITH SURFACE CURVATURE

(71) Applicant: Nederlandse Organisatie voor toegepast-natuurwetenschappelijk onderzoek TNO, s-Gravenhage (NL)

(72) Inventors: Edsger Constant Pieter Smits, Eindhoven (NL); Jan-Eric Jack Martijn Rubingh, Geldrop (NL); Marco Barink, Eindhoven (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 84 days.

(21) Appl. No.: 16/968,020

(22) PCT Filed: Feb. 18, 2019

(86) PCT No.: PCT/NL2019/050104
§ 371 (c)(1),
(2) Date: Aug. 6, 2020

(87) PCT Pub. No.: WO2019/160417
PCT Pub. Date: Aug. 22, 2019

(65) Prior Publication Data
US 2021/0368627 A1    Nov. 25, 2021

(30) Foreign Application Priority Data
Feb. 19, 2018   (EP) ..................................... 18157378

(51) Int. Cl.
*H05K 1/18* (2006.01)
*H05K 3/00* (2006.01)
(Continued)

(52) U.S. Cl.
CPC ......... *H05K 3/0014* (2013.01); *H05K 1/0393* (2013.01); *H05K 1/181* (2013.01);
(Continued)

(58) Field of Classification Search
CPC .... H05K 1/0393; H05K 1/181; H05K 3/0014; H05K 3/112
See application file for complete search history.

(56) References Cited

U.S. PATENT DOCUMENTS

2005/0206047 A1   9/2005   Lewison
2016/0316570 A1  10/2016   De Vaan

FOREIGN PATENT DOCUMENTS

JP       2004-356144 A     12/2004

OTHER PUBLICATIONS

European Patent Office, International Search Report in corresponding International Application No. PCT/NL2019/050104, dated Aug. 1, 2019 (2 pages).

*Primary Examiner* — Jeremy C Norris
(74) *Attorney, Agent, or Firm* — Leydig, Voit & Mayer, Ltd.

(57) ABSTRACT

A method of manufacturing a curved electronic device (100) and resulting product. A patterned layer of non-conductive support material (12*m*) is printed onto a thermoplastic substrate (11) to form a support pattern. An electrical circuit (13,14) is applied onto the support pattern (12), wherein the electrical circuit (13,14) comprises circuit lines (13) comprising a conductive material (13*m*) applied onto support lines (12*b*) of the pattern and electrical components (14) applied onto support islands (12*a*) of the pattern. A thermoforming process (P) is used for deforming (S) the substrate (11) while a relatively high resistance of the support material (12*m*) to the deforming maintains a structural integrity of the electrical circuit (13,14).

16 Claims, 2 Drawing Sheets

(51) Int. Cl.
*H05K 1/03* (2006.01)
*H05K 3/12* (2006.01)
(52) U.S. Cl.
CPC ....... *H05K 3/12* (2013.01); *H05K 2201/0129* (2013.01); *H05K 2201/09018* (2013.01); *H05K 2201/2009* (2013.01); *H05K 2203/1105* (2013.01); *H05K 2203/302* (2013.01)

THERMOFORMING AN ELECTRONIC DEVICE WITH SURFACE CURVATURE

CROSS-REFERENCE TO RELATED APPLICATIONS

This patent application is a U.S. National Phase of PCT International Application No. PCT/NL2019/050104, filed Feb. 18, 2019, which claims priority to European Application No. 18157378.3 filed Feb. 19, 2018, which are both expressly incorporated by reference in their entireties, including any references contained therein.

TECHNICAL FIELD AND BACKGROUND

The present disclosure relates to methods of manufacturing a curved electronic device by means of a thermoforming process and products resulting there from.

The inventors find that currently printed inmold electronics structures may suffer from reliability issues due to the instability of the substrate during the molding process. For example, it is difficult to reliably bond complex (heavy) components onto structures which will be inmolded. One remedy may include avoiding bonding complex components (QFN, LEDs) packages onto thermoformable substrates, or maybe find more stretchable electrical components and interconnect materials. Other solutions may involve use of foils such as PET/PEN onto which the electronics including components is integrated, cutout the foils to the right pattern and apply the foil to a substrate to thermoform the whole stack. However, cutting small patterns from a foil may be exceedingly difficult.

US 2016/316570 A1 describes a method for manufacturing a non-planar printed circuit board assembly, wherein damaging of electrical circuit traces is avoided by curing the patterns only after thermoforming. However, this puts restrictions on the handling of the unformed PCB and restricts the use of materials and process conditions. As further background US 2005/206047 A1 describes contoured circuit boards; JP 2004 356144 A describes a component mounting flexible circuit board.

It is desired to improve versatility and process conditions in the manufacture of electronic devices with ever small components and connections while preventing damage to the circuitry which may occur especially during thermoforming or thereafter.

SUMMARY

Aspect of the present disclosure provide improved methods of manufacturing a curved electronic device and resulting products. A patterned layer of non-conductive support material is printed to form a support pattern onto a substrate comprising a thermoplastic material. The support pattern comprises a plurality of support islands interconnected by support lines bridging open areas of the thermoplastic substrate without the support material between the support islands. An electrical circuit is applied onto the support pattern. The electrical circuit comprises circuit lines comprising a conductive material applied onto the support lines. Electrical components are applied onto the support islands which electrical components are electrically interconnected by the circuit lines. A thermoforming process with an elevated processing temperature is used for deforming a shape of the substrate with the support pattern and electrical circuit according to a predefined surface curvature.

By printing the support pattern instead of cutting the pattern from a foil, the present methods can be more versatile, more accurate and tailored to ever smaller circuit patterns. The support material can have a higher resistance to the deforming than the thermoplastic material of the substrate. In this way the deforming can be concentrated to the open areas between the support islands while the higher resistance of the support material to the deforming maintains a structural integrity of the electrical circuit applied thereon during the thermoforming process. For example, the support material can be a relatively stiff material which does bend or stretch as easily as the thermoplastic substrate during the thermoforming process. For example, the support material may have a relatively high glass transition or melting temperature compared to the thermoplastic material so it remains relatively solid and/or more highly viscous during the thermoforming process.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The invention is described more fully hereinafter with reference to the accompanying drawings, in which embodiments of the invention are shown. In the drawings, the absolute and relative sizes of systems, components, layers, and regions may be exaggerated for clarity.

Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1A:
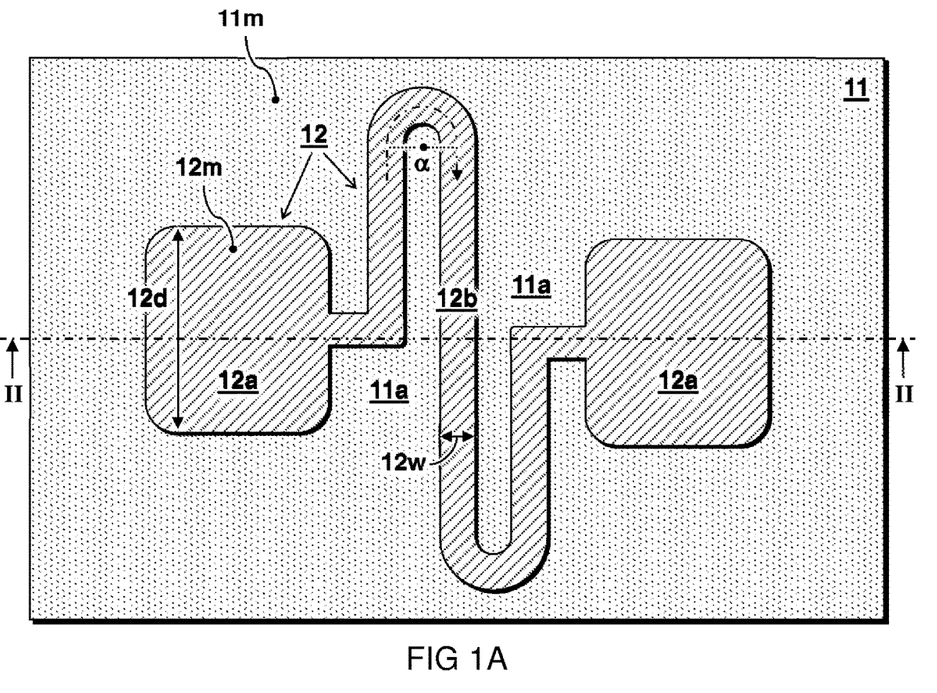
FIGS. 1A and 1B schematically illustrate top views of steps in manufacturing one embodiment of a curved electronic device.
Figure 1B:
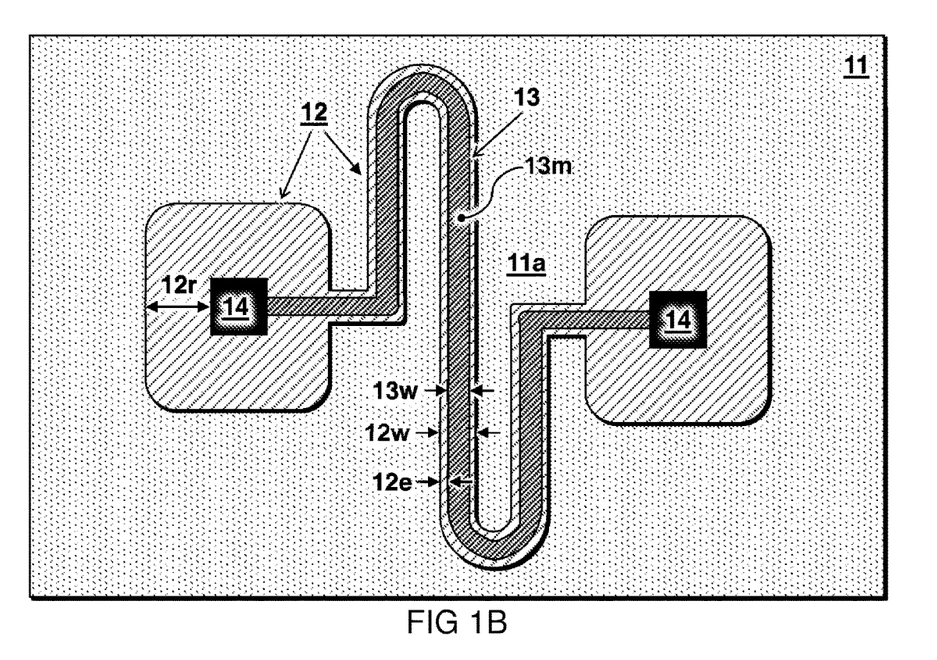

FIGS. 1A and 1B schematically illustrate top views of steps in manufacturing one embodiment of a curved electronic device. FIGS. 2A-2E schematically illustrate cross-section views of other or further steps in manufacturing the embodiment of the curved electronic device.

Figure 2A:
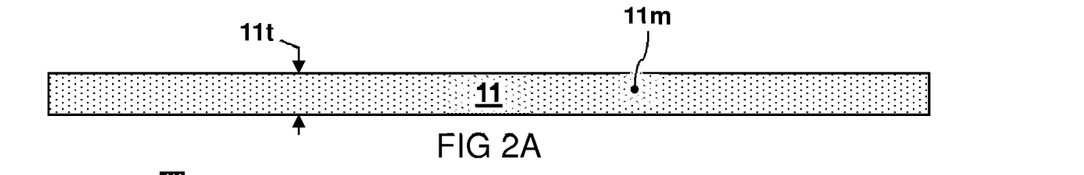
FIGS. 2A-2E schematically illustrate cross-section views of other or further steps in manufacturing the embodiment of the curved electronic device.

In one embodiment, e.g. as illustrated by FIG. 2A, a substrate 11 is provided comprising or essentially consisting of a thermoplastic material 11m. It will be recognized that a thermoplastic, or thermosoftening plastic, is a plastic material which may become pliable or moldable above a specific temperature and which may solidify (again) upon cooling. Thus, thermoplastics may be reshaped by heating and are typically used to produce shaped parts by various polymer processing techniques such as injection molding, compression molding, calendering, and extrusion. One preferred thermoplastic material 11m for the substrate 11 as described herein is Poly(methyl methacrylate) (PMMA), also known as acrylic, which is a transparent thermoplastic. Another preferred material is polyethylene terephthalate (PET) preferably with addition of glycol also known as (PETG) or Polycarbonate (PC). Other examples of thermoplastics may include e.g. Acrylonitrile butadiene styrene (ABS), Nylon or polyamide, Polylactic acid (PLA), Polybenzimidazole, Polyether sulfone, Polyoxymethylene, Polyetherether ketone, Polyetherimide, Polyethylene, Polyphenylene oxide, Polyphenylene sulfide, Polypropylene, Polystyrene, Polyvinyl chloride.

In one embodiment, as illustrated by FIG. 2A, a patterned layer of non-conductive support material 12m is applied by printing onto the substrate 11. This forms a support pattern 12. In one embodiment, the support pattern 12 comprises a polymer material. It will be recognized that a polymer is a large molecule, or macromolecule, composed of many repeated subunits. Polymers are typically created via polymerization of many small molecules, known as monomers. Their consequently large molecular mass relative to small molecule compounds typically produce unique physical properties, including toughness, viscoelasticity, and a tendency to form glasses and semicrystalline structures rather than crystals. Preferably, the support pattern 12 comprise an amorphous to semi-crystalline, medium cross linked polymer. Preferably, the crosslinking is sufficient to ensure that the film exhibits a high melt temperature while its brittleness remains low. For example, the support pattern 12 may comprise an epoxy, acrylic or polyimide. In a preferred embodiment, a reactive epoxy is used. It will be recognized that a polymer formed from epoxide precursors can be referred to as an epoxy, even if such materials may no longer contain epoxide groups or contain only a few residual epoxy groups that remain unreacted in the formation of the resin.

In a preferred embodiment, e.g. as illustrated by FIG. 1A, the support pattern 12 comprises a plurality of support islands 12a. In the embodiment shown, the substrate 11 also has open areas 11a between the support islands 12a without the support material 12m. In another or further preferred embodiment, as also shown in FIG. 1A, the support islands 12a can be interconnected by support lines 12b can thus function to bridge the open areas 11a.

Figure 2B:
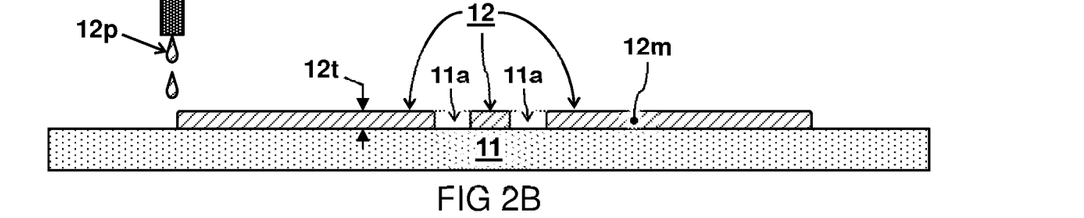
Figures 2C, 2D, 2E:
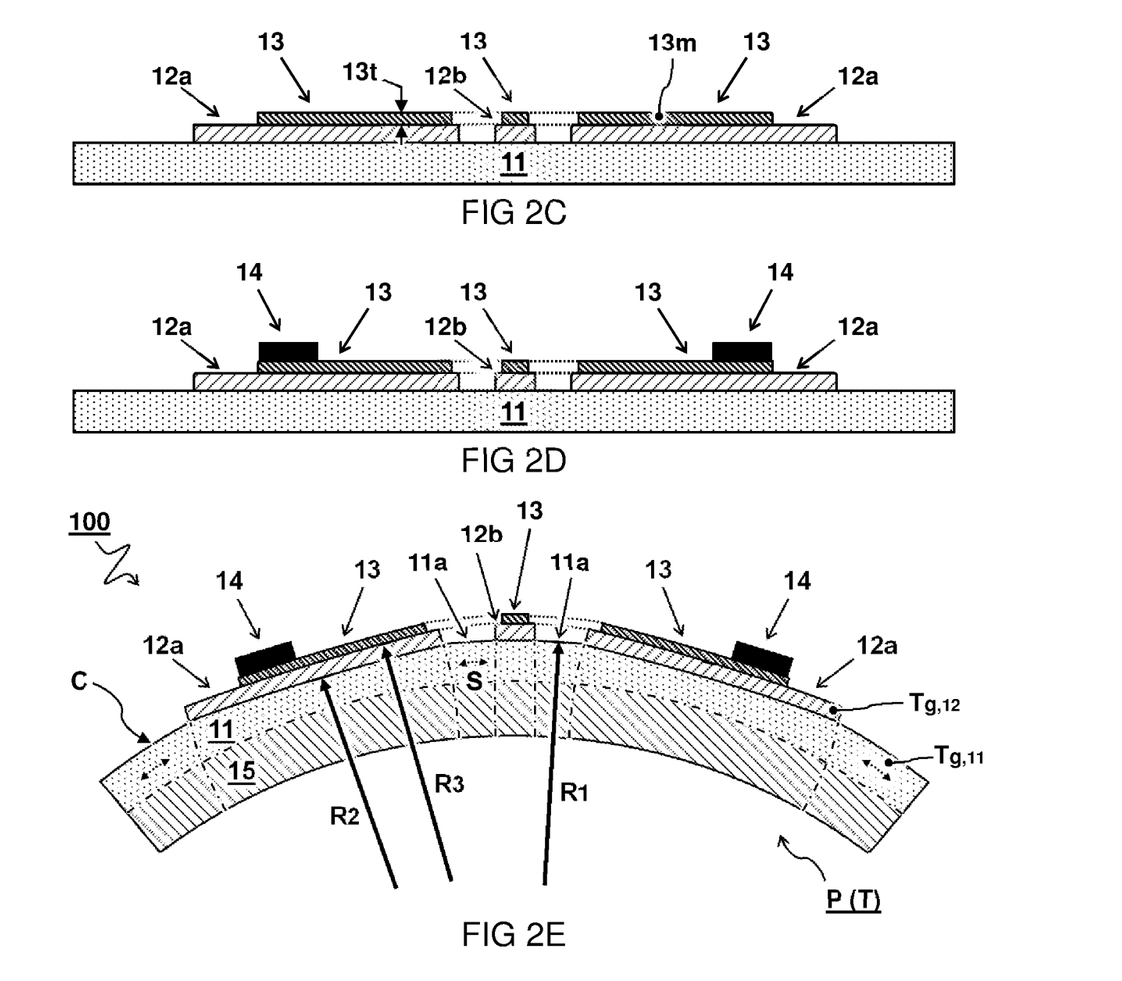

In one embodiment, e.g. as illustrated by FIGS. 2C and 2D, an electrical circuit 13,14 is applied onto the support pattern 12. This is also illustrated in FIG. 1B. In the embodiment shown, the electrical circuit comprises circuit lines 13 comprising a conductive material 13m which is applied onto the support lines 12b. In the embodiment shown, the circuit also comprises electrical components 14 applied onto the support islands 12a. The electrical components 14 can be electrically interconnected by the circuit lines 13 as shown schematically in FIG. 1B.

In a preferred embodiment, as shown e.g. in FIG. 2E, a thermoforming process "P" is applied for deforming "S" a shape of the substrate 11 with the support pattern 12 and electrical circuit 13,14. For example, the shape is deformed from a flat shape to a curved shape according to a predefined surface curvature "C". Of course many concave and/or convex curvatures can be envisaged. Typically the thermoforming process involve application of an elevated processing temperature "T" suitable for the thermoforming process. For example, the processing temperature is more than fifty degrees Celsius, typically more than eighty degrees, or more, e.g. between hundred and two hundred degrees.

In a preferred embodiment, the support material 12m has a higher resistance to the deforming than the thermoplastic material 11m of the substrate 11. In this way the deforming is concentrated to the open areas 11a between the support islands 12a while the higher resistance of the support material 12m to the deforming maintains a structural integrity of the electrical circuit 13,14 applied thereon during the thermoforming process "P". In FIG. 2E the deforming is schematically illustrated by the arrow "S" which may generally include changes to the curvature and/or length (stretching/compressing) of predominantly the substrate along one or more dimensions.

In one embodiment, the support material 12m has a higher stiffness than the thermoplastic material 11m of the substrate 11, e.g. at least ten percent higher, preferably at least fifty percent higher, at least twice as high, or more. The higher the relative stiffness of the support pattern material compared to the substrate material, the less the deformation at areas of the substrate covered by the support pattern. Preferably, the stiffness is higher at least during the thermoforming process "P" when the deforming takes place, and more preferably also there after to at least partially keep resisting the deforming "S" at areas where the electrical circuit is applied.

The elastic modulus will be recognized as a material property that may quantify or measure an object or substance's resistance to being deformed elastically (non-permanently) when a stress is applied to it. Generally, a stiffer material will have a higher elastic modulus. Specifying how stress and strain are to be measured, including directions, allows for different types of elastic moduli to be defined including the Young's modulus (E), the shear modulus or modulus of rigidity (G or μ), and the bulk modulus (K). In a preferred embodiment, the support pattern comprises or essentially consists of a support material 12m with a relatively high elastic modulus as expressed in one or more, preferably all, of the moduli defined above, at least compared to the thermoplastic material 11m.

In one embodiment, the support material 12m has a higher glass transition temperature "Tg" than the thermoplastic material 11m of the substrate 11. It will be recognized that glass transition can be a process which may occur between a range of temperatures. Different operational definitions of the glass transition temperature are in use which may differ a few Kelvins for a specific material. Nevertheless glass transitions temperatures according to any definition may still be relatively compared as being relatively lower or higher. For example, one definition which may relevant to the present applications, refers to the viscosity, e.g. fixing the glass transition temperature "Tg" at a value of $10^{12}$ Pa s. In one embodiment, the glass transition temperature of the support material 12m, so defined, is at least ten degrees Celsius higher than that of the thermoplastic material 11m, preferably at least twenty degrees Celsius, at least thirty or at least fifty. It will be appreciated that for a sufficiently different glass transition temperature, the processing temperature of the thermoforming process can be suitably selected there between.

In one embodiment, the thermoforming process "P" comprises heating at least the substrate 11 to a processing temperature "T" above a glass transition temperature "Tf"$_{,11}$ of the substrate 11, wherein the processing temperature is kept below a glass transition temperature "Tg"$_{,12}$ of the support pattern 12 or at least below a melting temperature of the support pattern 12. Of course, is also possible that the support material 12m does not have a glass transition, in which case the glass transition temperature can be considered infinite or the melting or disintegration temperate of the support material 12m can be substituted. Preferably, the support pattern 12 does not undergo glass transition or at least does not melt in the thermoforming process "P". At least, the support pattern 12 preferably has a higher melting temperature than the substrate 11. Alternatively, or in addition, the support pattern 12 may at least have a higher viscosity than the substrate 11 during the thermoforming process "P".

Preferably, the thermoplastic material 11m of the substrate 11 has a glass transition temperature which is not too high, e.g. below three hundred degrees Celsius, or below two hundred degrees Celsius, at least below a damage temperature of the electrical components 14. Preferably, the thermoplastic material 11m has a glass transition temperature which is not too low, e.g. above seventy degrees Celsius, preferably above hundred degrees Celsius, at least high enough to prevent inadvertent deformation of the electronic device 100 during normal use after manufacturing. For example, Tg values of commercial grades of PMMA typically range from 85 to 165° C.

In preferred embodiments, the deforming comprises bending the substrate 11 according to the predefined surface curvature "C". For example, the substrate 11 is deformed using a mould 15, as illustrated in FIG. 2E, which can determine the predefined surface curvature "C". The mould 15 may also become part of the electronic device 100 in some embodiments, or a further support structure can be provided in addition to the mould. Also other molding or thermoforming processes than shown can be envisaged for deforming the shape of the substrate, support layer and circuit.

In preferred embodiments, the support pattern 12 covers some areas of the substrate 11 while leaving other areas 11a between the covered areas open, i.e. without the support pattern 12. The open areas may provide most of the deformation. In some embodiments, the deforming, e.g. bending, comprises stretching and/or compressing different areas of the substrate 11. Advantageously, the support pattern 12 may at least partially prevents the deforming "S" of the substrate 11 at positions of the electrical circuit 13,14. For example, the deforming "S" is preferably concentrated to the open areas 11a of the substrate 11 between the support pattern 12. Accordingly, an amount of stretching, compressing and/or bending is concentrated to the open areas 11a of the substrate 11 not covered by the support pattern 12.

In some embodiments, as illustrated schematically by FIG. 2E, a first radius of curvature R1 at the open areas 11a of the substrate 11 is smaller than a second radius of curvature R2 of the substrate areas covered by the support pattern 12, in particular the areas covered by the support islands 12a. In other words the curvature may be higher at the open areas 11a than the covered areas For example, the first radius of curvature R1 can be less than one meter, less than half meter, or less, e.g. between one and ten centimeter. For example, the second radius of curvature R2 can be larger than the first radius of curvature R1 by more than ten percent (i.e. a factor 1.1), in some cases more than twenty percent or even more, e.g. fifty percent or even more than a factor two. In some embodiments, the second radius of curvature R2 is kept above a threshold radius preventing structural damage to the electrical circuit 13,14. For example, the support pattern 12 maintains the second radius of curvature R2 above a threshold of more than one meter, more than two meter, or even more, e.g. keeping a substantially flat shape particularly at the support islands 12a. The flatter the support pattern 12 is kept at areas where the electrical circuit 13,14 is applied, the more damage may be prevented. Typically, a third radius of curvature R3 as illustrated being experienced by the circuit pattern 13,14 deposited on top of the support pattern 12 may be the same or larger than the second radius of curvature R2 (i.e. even less curved).

In some embodiments, an amount of stretching or compressing of the substrate 11 at the open areas 11a of the substrate 11 is higher than at the substrate areas covered by the support pattern 12, in particular the areas covered by the support islands 12a. In other words the stretching or compressing particularly along the substrate surface may be particularly concentrated to the open areas 11a between the support islands 12a. For example, the stretching or compressing at the areas covered by the support pattern 12 may be kept below a threshold percentage for preventing structural damage to the electrical circuit 13,14. For example, the support pattern 12 maintains its length along one or more dimensions parallel to the substrate surface within twenty percent (i.e. stretching the length with a factor less than 1.2 or a compressing the length with a factor more than 0.8), preferably the length is maintained within ten percent, more preferably within five percent, or even less than one percent, or substantially no stretching/compressing. The more the stretching and compressing along the surfaces is prevented at least along a length of the support lines 12b and circuit lines 13 or along both dimensions of the support islands 12a, the better damage may be prevented. It will be appreciated that the stretching (or bending) of the open areas 11a between the support islands 12a does not necessarily lead to much stretching along (or bending transverse to) the length of the support lines 12b particularly if these are provided with buffer structures such as meandering lines.

In some embodiments, e.g. as shown, the support pattern 12 comprises a plurality of support islands 12a e.g. wherein the electrical circuit comprises electrical components 14 placed on the support islands 12a. In some embodiments, e.g. as illustrated in FIG. 1A the support islands 12a have a minimum cross-section diameter 12d along a surface of the substrate of e.g. more than half a millimeter, more than one millimeter, more than half a centimeter, more than a centimeter, or more. In other or further embodiments, e.g. as illustrated in FIG. 1B, the support islands 12a provide a minimal margin 12r around the respective one or more electrical components 14 on the island. Preferably the minimal margin 12r of the support islands 12a between the respective one or more components 14 and an edge of the island 12, is e.g. more than half a millimeter, more than one millimeter, more than half a centimeter, or more. The inventors find that larger margins may better protect the respective components against deformation especially when the component is placed at or near a center of the respective island.

The inventors find that larger islands may be less prone to migration during the thermoforming process. So increasing the island size may ensure the relative placement of the component to a predefined position which can be particularly beneficial for components such as LEDs and/or buttons providing signaling or outside interaction with the electronic device 100. In addition to the electrical components 14, also electrical (external) connectors to the circuit are preferably placed on top of relatively large support islands. This may ensure more predictable placement of the connector making it easier to form a connection to the electronic device 100.

In some embodiments, e.g. as shown, the support pattern 12 comprises a plurality of support lines 12b e.g. wherein the electrical circuit comprises circuit lines 13 i.e. electrically conducting lanes forming electrical interconnections on top of the support lines 12b. Preferably, the support lines 12b follow respective paths of respective corresponding circuit lines 13 applied on top thereof. In other words, the paths of circuit lines 13 are preferably parallel with the paths of the support lines 12b. In the embodiment shown, the circuit lines 13 form electrical interconnections between the electrical components 14. Similarly, the support lines 12b may form supporting interconnections between the support islands 12a.

In some embodiments, e.g. as illustrated in FIG. 1A, the support lanes or lines 12b have a lane width 12w of e.g. at least ten micrometer, preferably at least fifty micrometer, e.g. between hundred and five hundred micrometer, preferably less than two hundred micrometers. On the one hand, the support lines are preferably wide enough to provide sufficient support and protect the circuit lines 13 against damage. On the other hand, the support lines are preferably sufficiently narrow to not to hinder a flexibility which may be provided by the pattern of the circuit lines 13, e.g. a meandering pattern as shown. In some preferred embodiments, the lane width 12w is (almost) equal to or only a bit larger than a width 13w of the circuit lines 13. For example, the edges of the support lines 12b extending beyond the edges circuit lines 13 have an edge width 12e less than hundred micrometer, preferably less than fifty micrometer, less than twenty micrometer or less, e.g. ranging between no edge and an edge of less than ten micrometer. In other or further embodiments, a width 13w of the circuit lanes 13 (along a surface of the substrate) can be less than two hundred micrometer, preferably less than hundred micrometer, e.g. between ten and fifty micrometer. Relatively narrow support lines may provide better flexibility while preventing stretching the circuit lines 13 along there length.

In a preferred embodiment, the support lines 12b, and circuit lines 13 on top, comprise a buffer structure, e.g. as shown in FIG. 1A following a meandering or curved path between support islands 12a. Typically, a length along the meandering or curved path may higher than a shortest straight distance between the two end points of the path (not along the path), e.g. higher by at least fifty percent, preferably at least a factor two, at least a factor three, at least a factor five, or more. The higher the ratio between the length along the path and the straight distance between the end points, the more the path is able to rearrange or stretch (uncoil) without having to break the circuit lines 13.

In some embodiments, the meandering path changes its direction multiple times in opposite directions, e.g. at least twice, preferably at least three, four or more times. This may allow the path to uncoil providing additional flexibility. In some embodiments, as illustrated in FIG. 1A, each time the direction may changes over an angle "a" of at least forty degrees plane angle, preferably at least ninety degrees, at least hundred-thirty, or even hundred-eighty degrees, or more (e.g. in a swirl). In some embodiments, the direction can change back and forth. For example, in the embodiment shown, following the circuit lane support pattern 12b between the support islands 12a, the path first bends left over an angle of about ninety degrees, then at the top it bends right over an angle of about hundred eighty degrees, then at the bottom it bends left again over an angle of about hundred eighty degrees, and finally it bends right again over an angle of about ninety degrees. Of course also other meandering patterns can be envisaged.

In one embodiment, as illustrated e.g. by FIG. 2B, the support pattern 12 has certain a layer thickness 12t, e.g. between one and hundred micrometers, preferably between five and fifty micrometers, more preferably between ten and twenty micrometer. In some embodiments (not shown), the layer thickness may be variable, e.g. thicker at the support islands 12a than at the support lines 12b. Preferably, at least the support pattern 12 is capable of maintaining dimensional integrity of the electronic circuitry on top. Also preferably, at least the support lines 12b and circuit lines 13 on top may allow limited stretching. For example the support pattern 12 has an elongation to break of at least ten percent, e.g. allowing elongation of a support lane by factor 1.1 e.g. along a length of the lane without breaking apart and/or the circuit losing essential functionality. For example, the support pattern 12 can have at least some elasticity allowing for reversible deformation, e.g. returning to an original form event when elongated by at least one percent i.e. a factor 1.01, or more, e.g. between two and five percent. For example, in some embodiments, the support material 12m has a Young's modulus between 100 MPa-10 GPa. Also preferably, the support pattern 12 does not considerably soften or melt during the thermoforming process which may otherwise result in an undesired large drop of the Young's modulus.

As described herein, the support pattern 12 preferably comprises or is formed by a printable or printed material. In some embodiments, the printing of the support pattern 12 comprises applying a (liquid) printing material 12p onto the substrate 11. In other or further embodiments, the printing material 12p may be hardened to form the support material 12m of the support pattern 12. For example, the printing material 12p comprises s precursor (e.g. monomers) and the hardening comprises polymerizing and at least partially crosslinking the precursor to form the support pattern 12. For example, the printing material 12p comprises a solvent and the hardening comprises drying the solvent leaving the support pattern 12. Also further or other processes can be envisaged for hardening the printing material 12p, e.g. heat treatment and/or hardening with light, e.g. UV. Suitable processes for printing of the support pattern 12 may e.g. comprise screen printing. This may be performed in a sheet to sheet manner but could also be done in a continuous R2R manner, using a stop and go process. Alternatively a rotary screen print process can be utilized.

As described herein, the circuit lines 13 comprise electrically conductive material. Accordingly, wherein the circuit lines 13 are configured to conduct electricity e.g. between the electrical components 14 anchor between the components and (external) electrical connections. In a preferred embodiment, the circuit lines 13 comprise a metal ink, most preferably silver ink. In some embodiments, the circuit lines 13 are deposited, e.g. also by printing, on top of the support lines 12b. Preferably, the circuit lines 13 provide an elongation to break of at least one percent, preferably at least five percent, or even ten percent, or more, without losing essential functionality. Preferably, the circuit lines 13 can be bent over a limited radius transverse to their length of at least one meter, at least half a meter, or less, e.g. allowing the lines to be bent over a radius of ten centimeter without the circuit losing essential functionality.

In some embodiments, the electrical component 14 comprises a surface mounted device (SMD). For example, the electrical component 14 comprises an integrated circuit, or a transducer such as light emitting devices (LED), or an interface component such as push button, switch, et cetera, or any other functional components of the electronic device 100. For example, the electrical components 14 may be placed e.g. soldered or otherwise bonded with a conductive adhesive such as ICA onto bonding pads of the electrical circuit e.g. circuit lanes. For example, the placement may involve pick-and-place, light induced forward transfer (LIFT), or other placement method.

In some embodiments it may be preferred to apply an underfill, e.g. between electrical connections or bond pads of the circuit before placing the electrical component 14. For example, the underfill fills a space between the support island 12a and the electrical component 14. In some embodiments, the underfill is also printed, preferably using the same material as the support pattern 12. In some embodiments, the electrical component 14 may itself be a printed component or otherwise built from deposited materials.

In some embodiments (not shown), a non-conductive top layer is applied on top of the electrical circuit 13,14. Optionally, the top player comprises another support pattern with the same or similar pattern as the support pattern 12 below the circuit. Alternatively, or additionally, the top layer may comprise another thermoplastic substrate and the circuit can be sandwiched between the substrates.

The methods as described herein may provide a corresponding curved electronic device 100. In one embodiment, the electronic device 100 comprises a substrate 11 comprising a thermoplastic material 11m. Another or further embodiment, comprises a patterned layer of non-conductive printable support material 12m forming a support pattern 12 on the substrate 11. An electrical circuit 13,14 can be applied onto the support pattern 12. Notably, a shape of the substrate 11 with the support pattern 12 and electrical circuit 13,14 is formed by a thermoforming process "P" according to a predefined surface curvature "C". In one application, the electronic device 100 comprises a curved dash-board for a car, wherein electrical components 14 such as lights and buttons are integrated in the dash-board. Of course many other applications can be envisaged.

For the purpose of clarity and a concise description, features are described herein as part of the same or separate embodiments, however, it will be appreciated that the scope of the invention may include embodiments having combinations of all or some of the features described. Of course, it is to be appreciated that any one of the above embodiments or processes may be combined with one or more other embodiments or processes to provide even further improvements in finding and matching designs and advantages. It is appreciated that this disclosure offers particular advantages to manufacturing electronic devices with curved surfaces in a thermoforming process, and in general can be applied for any application wherein electronic circuits are to be protected against deformation of an underlying substrate by means of a support pattern.

In some embodiments, the present solutions may comprise printing a polymer electrically insulating film (dielectric) underneath a full circuitry ensuring a reliable well defined substrate during the thermoform process. The film with a (high) fracture strength (e.g. ultimate elongation of >10% and elastic strain of >1%) e.g. comparable to PEN/PET/PI is preferably capable of ensuring the dimensional integrity of the electronic circuitry and the components on top of it. Preferably, at least the support structure does not melt which may otherwise result in a large drop in Young's modulus) at the thermoforming temperature. This would lead to an undefined redistribution of the printed circuitry during the thermoforming process. To ensure that key sections of the circuitry remain in place thin mechanical buffer structures in the shape of meanders may be included to accommodate for local elongations. Such structures may be designed according to mechanical rules where the width of the structures can be limited to reduce the forces needed for deformation.

It will be appreciated that some aspects of the present solutions can provide a printed only method while ensuring the reliability of a laminated based in-mould system. The solutions may combine ease of fabrication with a higher level of reliability. As well there are can be less stringent requirements to the used metal inks and interconnect materials. Using a printing only solution enables smaller mechanical buffer structures (viz. meander mesh wires) providing superior performance compared to the conventional laminate based solution. One step may comprise defining a design which has been adjusted to the structure to be thermoformed. In this respect it can be useful to include sufficient redundant wiring on the elements that will be thermoformed.

The choice of support material, e.g. polymer dielectric film, to be printed may define the possible yield strength, young's modulus as well as fracture strength. An amorphous to semi-crystalline, medium cross linked polymer with low filler loading is preferred. For example, the total dry film thickness may be in the order of 10-20 μm. In the case of meander wire structures, width around 100-200 μm are recommended to provide a high level of stretchability. The support layer, e.g. polymer film can be only at the bottom, but it may be advisable to print it on both sides.

For the metallization a slightly stretchable/formable metal silver ink can be beneficial to ensure that possible elongations of the metal structures on the film during forming can be compensated. On the other hand, with proper design rules also conventional silver pastes or even pure metal films such as electroless plated copper films can be employed.

Electrical components, e.g. SMD, can be placed on areas of low mechanical stress the ensure as low as possible shear on the component during forming. Bonding can be realized e.g. via ICA or solder. Optionally a high young's modulus underfill material can be printed underneath the SMD component after to bonding. This may ensure that there is no structural deformation underneath the bond pads. SMD components bonded on this film may have a stable structure reducing the chance of deformations underneath the bond pads. The present solutions may also be combined with electroless printing to enable pure metal electrical structures. Using meanders much larger deformations can be applied than with printed only structures since the structure may reconfigure itself. This may open up new options for more extreme forms.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. A method of manufacturing a curved electronic device the method comprising:
    providing a substrate comprising a thermoplastic material;
    printing a patterned layer of non-conductive support material to form a support pattern onto the substrate, wherein the support pattern comprises support islands interconnected by support lines bridging open areas of the substrate without the support material between the support islands;
    applying an electrical circuit onto the support pattern, wherein the electrical circuit comprises circuit lines comprising a conductive material applied onto the support lines, and electrical components applied onto the support islands, the electrical components being electrically interconnected by the circuit lines; and
    deforming, using a thermoforming process with an elevated processing temperature, a shape of the substrate with the support pattern and electrical circuit according to a predefined surface curvature,
    wherein the support material has a higher resistance to the deforming than the thermoplastic material of the substrate at the processing temperature, and
    wherein the deforming is concentrated to the open areas between the support islands while the higher resistance of the support material to the deforming maintains a structural integrity of the electrical circuit applied thereon during the thermoforming process.

2. The method according to claim 1, wherein the support material has a higher glass transition temperature than the thermoplastic material of the substrate.

3. The method according to claim 1, wherein the thermoforming process comprises heating at least the substrate to a processing temperature above a glass transition temperature of the substrate, wherein the processing temperature is kept below a glass transition temperature of the support pattern.

4. The method according to claim 1, wherein the support material has a higher stiffness than the thermoplastic material of the substrate at least during the thermoforming process at the processing temperature.

5. The method according to claim 1, wherein the deforming comprises a bending, stretching, and/or compressing the substrate according to the predefined surface curvature,
    wherein the support pattern at least partially prevents the deforming of the substrate at positions of the electrical circuit, and
    wherein an amount of the bending, stretching, and/or compressing the substrate is concentrated to the open areas of the substrate not covered by the support pattern.

6. The method according to claim 1, wherein a first radius of curvature at the open areas of the substrate is smaller than a second radius of curvature of the substrate areas covered by the support pattern, wherein the second radius of curvature (R2) is kept above a threshold radius preventing structural damage to the electrical circuit (13,14).

7. The method according to claim 1, wherein a stretching or compressing at areas covered by the support pattern is kept below a threshold percentage for preventing structural damage to the electrical circuit.

8. The method according to claim 1, wherein the support pattern has a layer thickness between five and fifty micrometers, wherein the support islands have a minimum cross-section diameter of more than half a millimeter, and wherein the support lines have a lane width between fifty and two hundred micrometers.

9. The method according to any of the preceding claims claim 1, wherein the circuit lines follow a path of the support lines, wherein the support lines have a lane width that is equal to or slightly larger than a width of the circuit lines, and wherein edges of the support lines extending beyond edges circuit lines have an edge width less than hundred micrometer.

10. The method according to claim 1, wherein the support lines and the circuit lines follow a meandering path between support islands, and wherein a length along the meandering path is higher than a shortest straight distance between two end points of the meandering path by at least a factor of two.

11. The method according to claim 1, wherein support material forming the support pattern comprises a polymer material.

12. The method according to claim 1, wherein the printing of the support pattern comprises applying a liquid printing material onto the substrate by screen printing and hardening the printing material to form the support material of the support pattern.

13. The method according to claim 1, wherein the circuit lines comprise a metal ink and the electrical component comprises a surface mounted device placed before the thermoforming process.

14. The method according to claim 1, wherein a non-conductive top layer is applied on top of the electrical circuit.

15. The method according to claim 1, wherein a first radius of curvature at the open areas of the substrate is smaller than a second radius of curvature of the substrate areas covered by the support islands, wherein the second radius of curvature is kept above a threshold radius preventing structural damage to the electrical circuit.

16. A curved electronic device comprising
    a substrate comprising a thermoplastic material;
    a patterned layer of non-conductive printed support material forming a support pattern on the substrate, wherein the support pattern comprises support islands interconnected by support lines bridging open areas of the substrate without the support material between the support islands; and
    an electrical circuit applied onto the support pattern, wherein the electrical circuit comprises:
        circuit lines comprising a conductive material applied onto the support lines, and
        electrical components applied onto the support islands which, the electrical components being electrically interconnected by the circuit lines;
    wherein a shape of the substrate with the support pattern and electrical circuit is deformed by a thermoforming process according to a predefined surface curvature,
    wherein the support material has a higher resistance to the deforming than the thermoplastic material of the substrate, and
    wherein the deforming is concentrated to the open areas between the support islands while the higher resistance of the support material to the deforming maintains a structural integrity of the electrical circuit applied thereon during the thermoforming process.

\* \* \* \* \*